United States Patent [19]

Andricacos et al.

[11] Patent Number: 6,090,710
[45] Date of Patent: Jul. 18, 2000

[54] METHOD OF MAKING COPPER ALLOYS FOR CHIP AND PACKAGE INTERCONNECTIONS

[75] Inventors: Panayotis Constantinou Andricacos, Croton-on-Hudson, N.Y.; Hariklia Deligianni, Edgewater, N.J.; James McKell Edwin Harper, Yorktown Heights, N.Y.; Chao-Kun Hu, Somers, N.Y.; Dale Jonathan Pearson, Yorktown Heights, N.Y.; Scott Kevin Reynolds, Granite Springs, N.Y.; King-Ning Tu, Los Angeles, Calif.; Cyprian Emeka Uzoh, Hopewell Junction, N.Y.

[73] Assignee: International Business Machines Corporation, Armonk, N.Y.

[21] Appl. No.: 08/911,808

[22] Filed: Aug. 15, 1997

Related U.S. Application Data

[62] Division of application No. 08/495,249, Jun. 27, 1995, abandoned.

[51] Int. Cl.[7] .................................................. H01L 21/44
[52] U.S. Cl. ........................ 438/687; 438/686; 438/688; 438/660; 438/661; 438/662; 438/663
[58] Field of Search .................................... 438/687, 686, 438/688, 660, 661, 662, 663

[56] References Cited

U.S. PATENT DOCUMENTS

| | | | |
|---|---|---|---|
| 4,120,758 | 10/1978 | Rippere | 204/10 |
| 4,388,346 | 6/1983 | Bickler | 438/687 |
| 4,400,351 | 8/1983 | Komori et al. | . |
| 4,443,274 | 4/1984 | Brock et al. | 148/6.31 |
| 4,511,410 | 4/1985 | Shapiro et al. | 148/13.2 |
| 4,586,967 | 5/1986 | Shapiro et al. | . |
| 4,612,411 | 9/1986 | Wieting et al. | 136/265 |
| 4,749,548 | 6/1988 | Akatsu et al. | . |
| 4,798,660 | 1/1989 | Ermer et al. | 204/192.17 |
| 4,830,933 | 5/1989 | Hodes et al. | 428/646 |
| 4,915,745 | 4/1990 | Pollocke et al. | 136/265 |
| 5,004,520 | 4/1991 | Tsuji et al. | . |
| 5,021,105 | 6/1991 | Asai et al. | . |
| 5,023,698 | 6/1991 | Kobayashi et al. | . |
| 5,077,005 | 12/1991 | Kato | . |
| 5,221,411 | 6/1993 | Narayan | 156/603 |
| 5,391,517 | 2/1995 | Gelatos et al. | 438/687 |
| 5,656,860 | 8/1997 | Lee | 257/751 |
| 5,780,172 | 7/1998 | Fister et al. | 428/647 |
| 5,821,627 | 10/1998 | Mori et al. | 257/780 |
| 5,916,695 | 6/1999 | Fister et al. | 428/647 |
| 6,010,960 | 1/2000 | Nogami | 438/687 |

FOREIGN PATENT DOCUMENTS

| | | |
|---|---|---|
| 0 335 383 | 10/1989 | European Pat. Off. . |
| 0 460 454 | 12/1991 | European Pat. Off. . |
| 63-266052 | 11/1988 | Japan . |
| 1-056 842 | 3/1989 | Japan . |

OTHER PUBLICATIONS

Vol. 013, No. 079 (C–571) Patent Abstract of Japan, 22, Feb. 1989.
Vol. 37 No. 10 IBM Technical Disclosure Bulletin,, Oct. 10, 1994, pp. 61~62, XP002098676, New York, U.S.
Vol. 01 No. 255 (C–606) Patent Abstract of Japan, Jun. 13, 1989.

*Primary Examiner*—John F. Niebling
*Assistant Examiner*—Lynne A. Gurley
*Attorney, Agent, or Firm*—Randy Tung; Robert Trepp

[57] ABSTRACT

A method of making Copper alloys containing between 0.01 and 10 weight percent of at least one alloying element selected from carbon, indium and tin is disclosed for improved electromigration resistance, low resistivity and good corrosion resistance that can be used in chip and package interconnections and conductors by first forming the copper alloy and then annealing it to cause the diffusion of the alloying element toward the grain boundaries between the grains in the alloy are disclosed.

16 Claims, 4 Drawing Sheets

METHOD OF MAKING COPPER ALLOYS FOR CHIP AND PACKAGE INTERCONNECTIONS

This is a divisional of application Ser. No. 08/495,249 filed on Jun. 27, 1995, now abandoned.

FIELD OF THE INVENTION

The present invention generally relates to copper alloys for chip and package interconnections and a method of making the same and more particularly, relates to copper alloys containing between 0.01~10 wt % of at least one alloying element selected from the group consisting of carbon, indium and tin for improved electromigration resistance, low resistivity and good corrosion resistance and a method of making such alloys.

BACKGROUND OF THE INVENTION

The technology of making interconnections for providing vias, lines and other recesses in semiconductor chip structures, flat panel displays, and package applications has been developed for many years. For instance, in developing interconnection technology for very-large-scale-integrated (VLSI) structures, aluminum has been utilized as the primary metal source for contacts and interconnects in semiconductor regions or devices located on a single substrate. Aluminum has been the material of choice because of its low cost, good ohmic contact and high conductivity. However, pure aluminum thin-film conductors have undesirable properties such as a low melting point which limits its use to low temperature processing, possible diffusion into the silicon during annealing which leads to contact and junction failure, and electromigration. Consequently, a number of aluminum alloys have been developed which provided advantages over pure aluminum. For instance, U.S. Pat. No. 4,566,177 discloses a conductive layer of an alloy of aluminum containing up to 3% by weight of silicon, copper, nickel, chromium and manganese was developed to improve electromigration resistance. U.S. Pat. No. 3,631,304 discloses aluminum alloys with aluminum oxide which were also used to improve electromigration resistance.

More recently developed VLSI and ULSI technology has placed more stringent demands on the wiring requirements due to the extremely high circuit densities and faster operating speeds required of such devices. This leads to higher current densities in increasingly smaller conductor lines. As a result, higher conductance wiring is desired which requires either larger cross-section wires for aluminum alloy conductors or a different wiring material that has a higher conductance. The obvious choice in the industry is to develop the latter using pure copper based on its desirable high conductivity.

In the formation of VLSI and ULSI interconnection structures such as vias and lines, copper is deposited into a line, via or other recesses to interconnect semiconductor regions or devices located on the same substrate. Copper is known to have problems at semiconductor device junctions due to its low electromigration resistance. The electromigration phenomenon occurs when the superposition of an electric field onto random thermal diffusion in a metallic solid causes a net drift of ions in the direction of the electron flow. Any diffusion of copper ions into the silicon substrate can cause device failure. In addition, pure copper does not adhere well to oxygen containing dielectrics such as silicon dioxide and polyimide.

U.S. Pat. No. 5,130,274, assigned to the common assignee of the present invention, discloses the use of a copper alloy containing an alloying element of less than 2 atomic percent by first depositing an alloy into the recess of a interconnection structure and then forming a copper alloy plug and a thin layer of an oxide of the alloying element on the exposed surface of the plug. However, the technique still does not satisfy the more stringent requirements in ULSI structures where critical dimensions of less than 0.5 $\mu$m place a considerable burden on thin film chip interconnections. The use of standard Al (Cu) alloy and a silicon dioxide dielectric in a deep-submicron logic circuit wiring structure results in a large circuit delay caused mainly by the wiring connections.

The use of Cu as an alternative material to Al (Cu) in ULSI wiring structures to increase the chip speed has been attempted by others. However, numerous problems are incurred in Cu interconnections such as the tendency of Cu to corrode and the fast diffusion rates of copper in thin films. It is known that pure Cu has a smaller electromigration activation energy, i.e., 0.5~0.75 eV, than that in Al (Cu) of 0.8~0.9 eV. This implies that the advantage of using Cu for reducing interconnection electromigration failure at chip operating conditions is largely compromised.

Other workers have attempted to use copper alloys in providing enhanced electromigration resistance. For instance, U.S. Pat. No. 5,023,698 teaches copper alloys containing at least one alloying element selected from the group of Al, Be, Cr, Fe, Mg, Ni, Si, Sn and Zn. U.S. Pat. No. 5,077,005 teaches copper alloys 25 containing at least one member selected from In, Cd, Sb, Bi, Ti, Ag, Sn, Pb, Zr and Hf where the weight percent of the alloying element used is between 0.0003 to 0.01. The copper alloys are used in TAB processes and as print circuit board members. U.S. Pat. No. 5,004,520 also teaches copper foil for film carrier application containing at least one alloying element selected from P, Al, Cd, Fe, Mg, Ni, Sn, Ag, Hf, Zn, B, As, Co, In, Mn, Si, Te, Cr and Zn with the alloying element concentrations from 0.03 to 0.5 weight percent. The alloys are used as connecting leads in integrated circuit chip mounting. Furthermore, U.S. Pat. No. 4,749,548 teaches copper alloys containing at least one alloying element selected from Cr, Zr, Li, P, Mg, Si, Al, Zn, Mn, Ni, Sn, Ti, Be, Fe, Co, Y, Ce, La, Nb, W, V, Ta, B, Hf, Mo and C. The alloying elements are used to increase the strength of the copper alloy. U.S. Pat. No. 1,960,740 further teaches a copper-indium alloy which contains indium between 10% to 50% in order to increase the copper hardness and the corrosion resistance. U.S. Pat. Nos. 5,243, 222 and 5,130,274 teach copper alloys for improved adhesion and formation of diffusion barriers. However, none of these prior work teaches copper alloys that are suitable in VLSI and ULSI on-chip or off-chip wiring interconnections that has high electromigration resistance, low resistivity and high corrosion resistance. Furthermore, none of these prior work recognized the structural requirement on a microstructure level for improving electromigration resistance and consequently, none of the prior work has taught the microstructure necessary in a copper alloy in order to achieve the desirable properties.

It is therefore an object of the present invention to provide copper alloys containing at least one alloying element that can be suitably used in chip and package interconnections.

It is another object of the present invention to provide copper alloys containing at least one alloying element for chip and package interconnections that is particularly suitable for VLSI and ULSI applications.

It is a further object of the present invention to provide copper alloys that contain at least one alloying element for chip and package interconnections that have improved electromigration resistance, low resistivity and high corrosion resistance.

It is another further object of the present invention to provide copper alloys containing at least one alloying element for use in chip and package interconnections that contain about 0.01~10 weight percent of the alloying element.

It is still another object of the present invention to provide copper alloys that contain at least one alloying element for chip and package interconnections that can be easily processed by various metal deposition techniques used in the semiconductor industry.

It is yet another object of the present invention to provide copper alloys that contain at least one alloying element for use in both on-chip and off-chip interconnection applications.

It is still another further object of the present invention to provide copper alloys that contain at least one alloying element for chip and package interconnections that forms microstructures having the at least one alloying element saturated at the grain boundaries.

It is yet another further object of the present invention to provide copper alloys containing at least one alloying element selected from indium, tin and carbon for use in chip and package interconnections that form microstructures wherein the concentration of the at least one alloying element at or near the grain boundaries is at least 120% that at areas not substantially near the grain boundaries.

It is still another further object of the present invention to provide conductors formed of copper alloys containing at least one alloying element for use in chip and package interconnections wherein the conductor can withstand a current density of at least $10^5$ Amp/cm$^2$.

SUMMARY OF THE INVENTION

In accordance with the present invention, copper alloys having at least one alloying element selected from the group of indium, tin and carbon for use in chip and package interconnections are provided. The copper alloys have greatly improved electromigration resistance, low resistivity and high corrosion resistance.

In a preferred embodiment, copper alloys containing between 0.01~10 weight percent of at least one alloying element selected from the group of carbon, indium and tin are provided. A more preferred range of the alloying element is between 0.5~2 weight percent. The alloying element is concentrated at the copper grain boundaries after a thermal annealing step which is part of the chip fabrication process. It was discovered that the concentration of an alloying element at or near a grain boundary area is at least 120% that at areas of the grain away from the boundaries. The migration rate of copper in a copper alloy interconnect is drastically reduced due to a Cu/solute (i.e., Cu/Sn, Cu/In, Cu/C) interaction at the copper surfaces, interfaces between copper and the surrounding layer (i.e., Cu/Ta, Cu/Si$_3$N$_4$) and grain boundaries. This resulted in an enhanced electromigration resistance so that stress induced voiding and hillocking are prevented and the oxidation rate in the copper interconnects is reduced. Chip and package interconnections made of the present invention copper alloys can withstand a high current density of at least $10^5$ Amp/Cm$^2$ due to its high electromigration resistance.

The present invention is also directed to interconnection structures made of Cu alloys for providing electrical connections in an integrated circuit chip and package, and conductors of Cu alloys for interconnecting a multilevel semiconductor structure through vias and lines situated thereinbetween.

The present invention is further directed to a method of forming a conductor for interconnecting a multilevel semiconductor structure through vias and lines situated therein-between by first forming a conductor of copper alloy containing at least one alloying element selected from carbon, tin and indium, and then heating the conductor at a temperature and for a length of time that is sufficient to cause a thermally induced diffusion process of the alloying element to move toward the grain boundaries such that a saturation of the alloying element is formed at the boundaries.

The present invention is further directed to a method of reducing electromigration in copper by first depositing a layer of copper and a layer of an alloying element of carbon, tin or indium juxtaposed to each other, and then heating the layers together at a temperature sufficient to cause the formation of a solid solution of copper alloy containing at least 90 weight percent copper.

BRIEF DESCRIPTION OF THE DRAWINGS

Other objects, features and advantages of the present invention will become apparent upon consideration of the specification and the appendant drawings, in which.

DETAILED DESCRIPTION OF THE PREFERRED EMBODIMENT

The present invention provides copper alloys containing at least one alloying element selected from the group of indium, tin and carbon for use in chip and package interconnections that provides improved electromigration resistance, low resistivity and improved corrosion resistance. The present invention copper alloys are particularly useful in advanced semiconductor structures such as VLSI and ULSI structures.

Figure 1:
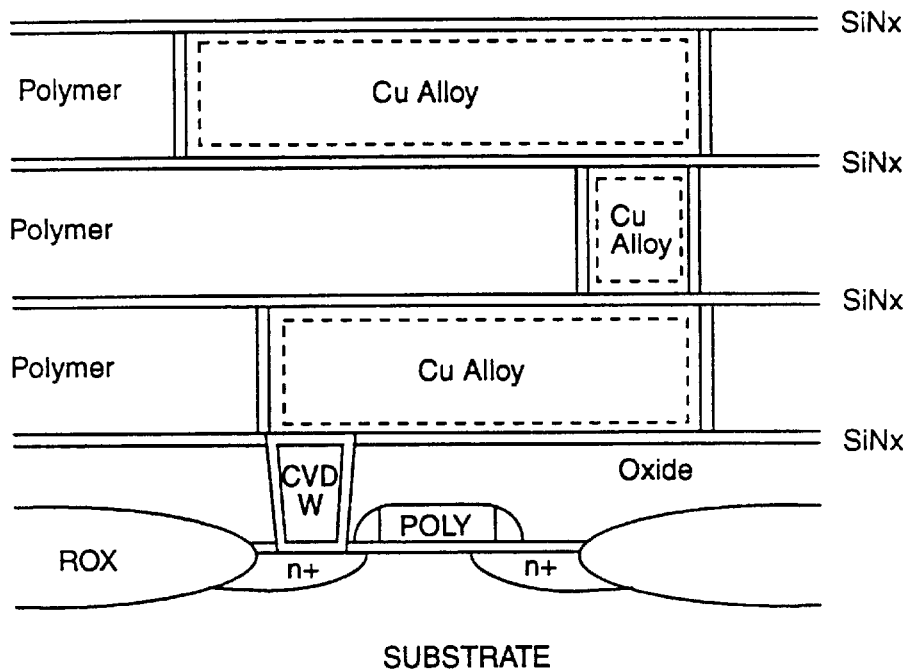
FIG. 1 is a schematic of an enlarged cross-sectional view of a semiconductor structure utilizing an embodiment of the present invention.

A copper alloy interconnect structure according to the present invention can be started with a first copper alloy conductor line that has a good diffusion barrier layer directly connected to a silicon device contact holes or through a Ti/N or a CVD W contact plug. Referring initially to FIG. 1, where it is shown a schematic of a cross-section of interconnections made of the present invention copper alloys. The structure is formed by various processing steps shown in FIGS. 2 through 5 of a first method for fabricating a copper wiring structure by a "Damascene" or "Dual Damascene" process. The copper alloys used contain at least one alloying element selected from the group of carbon, indium and tin at a concentration of between about 0.01 to about 10 weight percent. A preferred concentration of the alloying element is between about 0.5 to about 2 weight percent.

Figure 2:
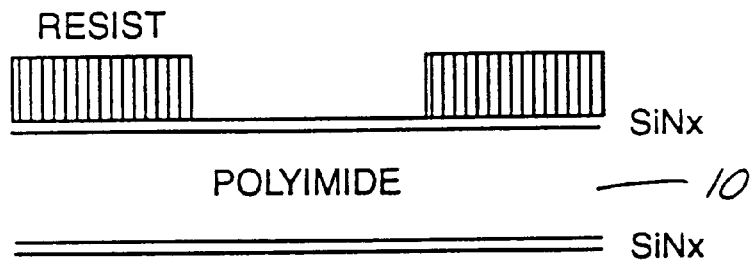
FIGS. 2 through 5 are enlarged cross-sectional views showing the processing steps required for forming the structure of FIG. 1.
Figure 3:
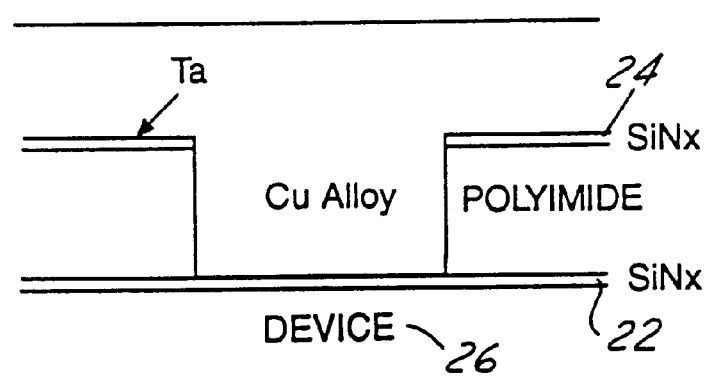

Referring now to FIGS. 2–5 where a process sequence for a copper interconnection structure is shown. A typical Damascene level is first fabricated by the deposition of a planar dielectric stack 10 as shown in FIG. 2. The dielectric stack 10 is then patterned and etched using standard lithographic and dry etch techniques to produce a desired wiring or via pattern. The process is then followed by a metal deposition of the Ta—Cu alloy metallurgy as shown in FIG. 3. The bottom nitride layer 22 is used as a diffusion barrier which is deposited on top of device 24 to protect against copper diffusion. The top nitride layer 24 is deposited as an etch mask to define a desired pattern, and then a recess for an interconnect is etched by a fluorine based plasma into the polymer layer. Several metal deposition techniques have been successfully used for filling the trench or via, for instance, a collimated spattering process, an ion cluster beam process, an electron cyclotron resonance process, a chemical vapor deposition process, an electroless plating process and an electrolytic plating process. It should be noted that co-deposition methods, in which Cu and an alloying element are co-deposited, can also be used in forming the present invention Cu alloys. For instance, these methods include co-sputtering, co-chemical vapor deposition and co-evaporation.

Figure 4:
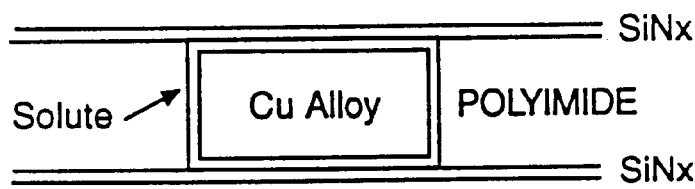
Figure 5:
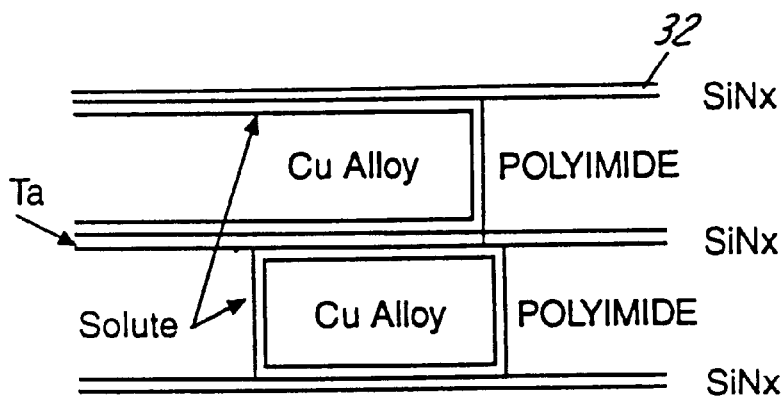
Figure 6:
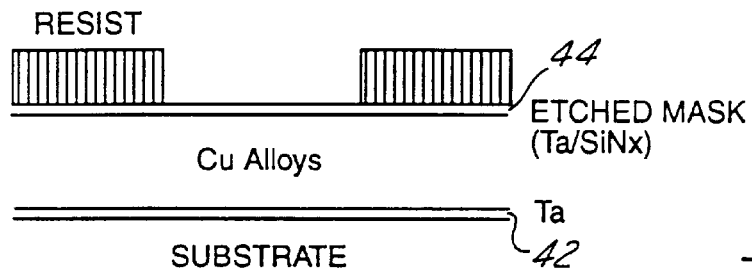
FIGS. 6 through 9 are enlarged cross-sectional views showing the processing steps for a semiconductor structure utilizing a copper etching method.

Generally, after a deposition process is completed, a chemical mechanical polishing method is used to remove the field metal layer leaving a planarized wiring and via imbedded in an insulator layer. The mask is then etched away by oxygen and stopped by a thin layer of nitride resist. The polymer layer can be replaced by any other insulating materials, such as a diamond-like carbon film. FIGS. 4 and 5 show subsequent processing steps wherein a Ta layer is deposited as an adhesion layer by a sputtering or collimated sputtering process. The final nitride layer 32 deposited, as shown in FIG. 6, functions as a passivation layer to protect the finished device from the environment.

During the fabrication process of a chip, the gradually built-up structure must be annealed or heat treated many times throughout the process in order to relieve the otherwise built-in stresses in various layers. The annealing temperature used is typically in the range of 150~450° C., while a more preferred annealing temperature range is 300~400° C. At such high temperatures, the solute in the Cu alleys (i.e. Sn, In or C) diffuses to and concentrates at the Cu interfaces and the grain boundaries of Cu alloy grains. For instance, it has been found that in Cu(Sn) alloys containing 1~2 weight percent Sn, the grain boundaries are saturated with Sn ions. When the amount of Sn in the Cu alloy is increased to 5 weight percent, the amount of Sn found at the grain boundaries is similar to that found when only 1~2 weight percent of Sn is present. The additional Sn is held inside the grains in a reservoir to replenish Sn that is depleted at the grain boundaries. Based on the phase diagram of Sn, it is anticipated that the improvement in electromigration resistance can be realized at Sn concentrations up to about 10 weight percent, even though the resistivity of the Cu alloy may be compromised to some extent. The concentration of solute ions effectively blocks any diffusion or electromigration of Cu ions across such interfaces or boundaries. The blocking of diffusion is effective even at large current flows. The electromigration resistance of the Cu alloy is therefore substantially improved. The subsequent levels shown in FIG. 1 are then fabricated by repeating the application of this process.

In the Damascene process, all wiring levels are planar at each level which typically results in an enhanced wafer yield when compared to the yield on a non-planar structure. A variety of dielectric materials of suitable dielectric constant can be used for the process, these include $SiO_2$, polymers, diamond-like carbon, flowable silicon oxide, spin-on class, etc.

Other techniques utilizing the present invention Cu alloys are the dry etching and lift-off process. In the dry etching technique, reactive ion etching (RIE) and ion milling have been shown to work satisfactorily in patterning Cu lines. After device fabrication in metal silicide and Ti/TiN/CVD W contact stud formation, a sequential Ta/Cu alloy/Ta trilayer is deposited.

Figure 7:
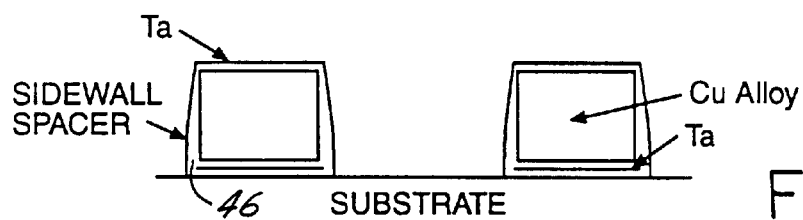
Figure 8:
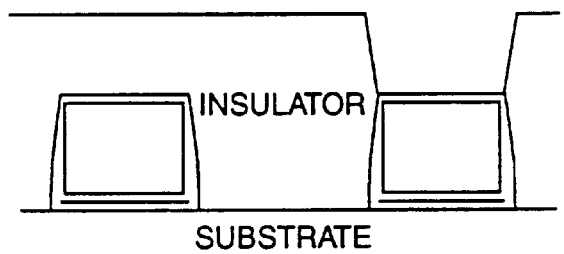
Figure 9:
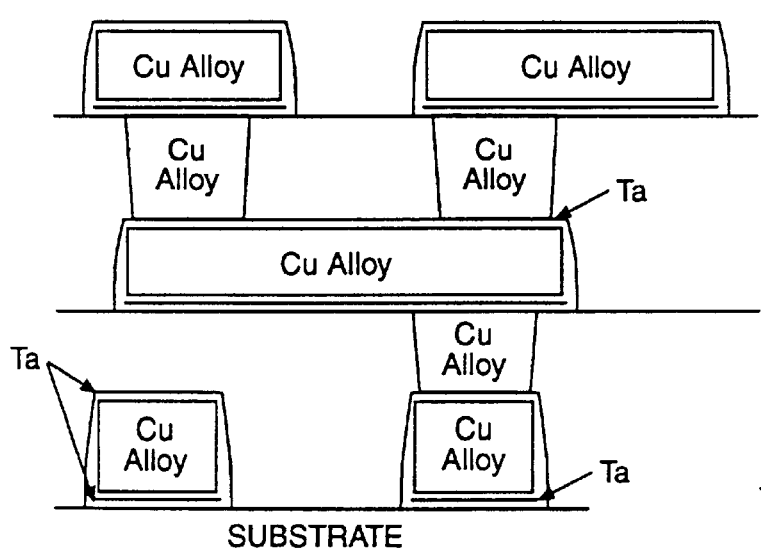

FIGS. 7~10 show the dry etching and lift-off processing sequence that utilizes the present invention Cu alloy. As shown in FIG. 7, a thin bottom layer 42 of Ta is first deposited as an adhesion/diffusion barrier layer and an etch stop. A top Ta layer 44 is then used as a durable mask and a passivation layer for Cu alloy. The Cu alloy lines are patterned by an ion beam etching technique or by a $Cl_2$-based plasma. When a lift-off process is used, a negative image of the metal line is patterned in the resist and then metal is evaporated into the opening of the resist. The metal on the resist is lifted-off when the resist is submerged in a resist solvent leaving the desired metal lines on the substrate. After the Cu lines are delineated, a thin dielectric sidewall spacer 46 of barrier material such as $Si_3N_4$ is deposited to prevent any possible reaction and intermixing between Cu alloy and the interlevel insulating material. This is shown in FIG. 8. A fully encapsulated Cu alloy line is obtained from this sequence of processing steps. FIG. 9 shows the deposition of a dielectric material and a subsequent interlayer planarization which can be achieved in a manner comparable to that used in the existing Al interconnection processing sequence.

One of the benefits of using a dry etching or a lift-off process for Cu alloy interconnections is that the processing steps are compatible with standard VLSI processing sequences with only minor modifications required. Another benefit of this processing approach is that Cu alloy metalization can be readily deposited by many techniques due to the fact that only blanket films are required. FIG. 9 shows a multilevel interconnection structure built by this technique. A total of five layers of Cu alloy interconnections are shown. It is contemplated that the present invention technology can be used to build at least a seven-layer structure.

Figure 10:
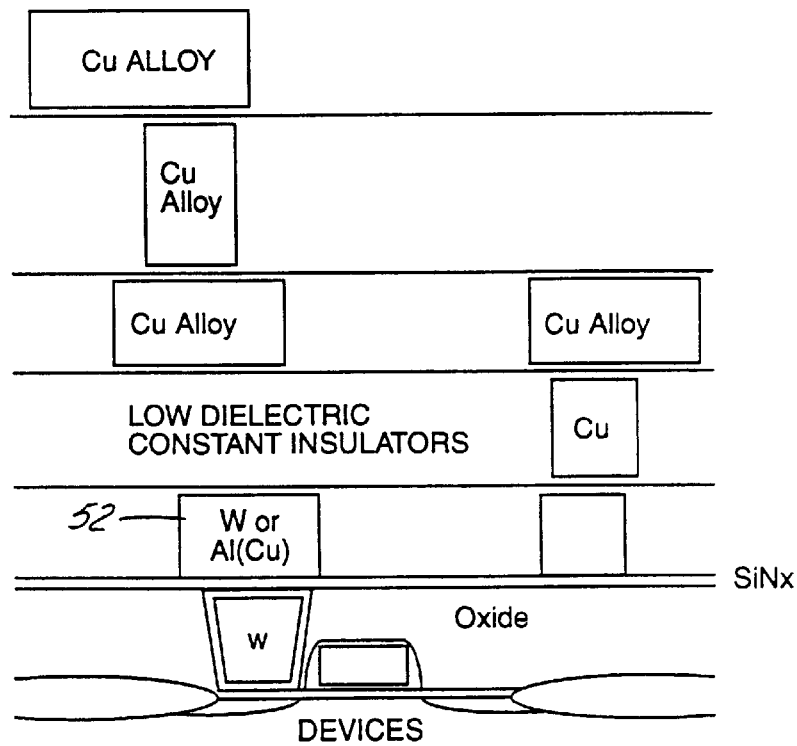
FIG. 10 is an enlarged cross-sectional view of another semiconductor structure utilizing the present invention copper alloys.

FIG. 10 is a schematic showing another embodiment of Cu alloy interconnections constructed in accordance with the present invention. In this embodiment, it is seen that Cu alloy can be mixed with other Al(Cu) or W metal interconnects. Since Cu frequently cause corrosion problems, it may be beneficial to use Al for wire bonding to aluminum wires. It may also be desirable to use Cu alloy at interconnect levels further away from a silicon device. It is known that migration of Cu ions into a silicon or silicide layer can cause contamination and the subsequent poisoning of the device. This is shown in FIG. 10 where the $M_1$ metal layer 52 is not constructed of Cu alloy but instead of W or Al(Cu). Cu alloy interconnects can therefore be mixed with other conductors at any level in a chip connection. For example, a multilevel Cu alloy interconnection can be combined with a W local interconnection which connects a device or can be connected to an Al alloy that has refractory metal underlayer lines at different levels.

The use of Cu metallurgy in multilevel interconnections raises other process concerns. For instance, Cu typically has poor adhesion to polyimide and $SiO_2$. A good metal adhesion/diffusion barrier layer, i.e., a Ta layer, is therefore required to improve adhesion. Using a thermal stress cycle of 500° C. for 4 hrs (in $N_2$ ambient), Ta was found a suitable conducting diffusion barrier and $Si_3N_4$ (deposited by PECVD) an effective insulating barrier. The segregation of solute atoms of In, Sn, C at the Cu surface further enhances adhesion.

It should be noted that while only on-chip wiring of interconnections such as vias and lines are shown in the above embodiments, the present invention Cu alloys can also be used in off-chip applications such as in wiring leads in tab automated bonding (TAB), ball grid array (BGA) and pin grid array (PGA) packages. The electromigration resistance of the wiring leads is greatly improved by utilizing present invention Cu alloys.

Atomic transport constantly occurs in metal films, especially during annealing, which tends to homogenize the solid solution through a random walk process of atomic diffusion. Under the chip fabrication and operation conditions, non-random (or directional) atomic motion is introduced by the application of external forces, such as thermally induced mechanical stress, applied voltage, current, thermal gradients, etc. Directional atomic motion results in mass transport from one location to another, which gives rise to reliability problems. The atomic flux under the external forces of electromigration and stress induced voiding can be obtained using the atomic density and the Ernst-Einstein relation as follows:

$$J_1 = n(D_{eff}/kT)F_1$$

where n is the density of atoms able to diffuse with the effective diffusivity ($D_{eff}$) along a metal line; T is the absolute temperature, and k is the Boltzmann constant. The force $F_1$ is given by $Z^*eE$ for electromigration and $\Delta(\delta\Omega)$ for stress induced migration, respectively, and $Z^*$ is the effective charge number, E is the electric field (gradient of the electrical potential), $\delta$ is stress and $\Omega$ is the atomic volume.

The damage formation and the corrosion rate in metal lines are controlled by the atomic flux. The force terms in the equation are determined by the chip fabrication and operation conditions, the amount of atomic flux is therefore directly related to the atomic diffusion. The solute atoms, such as Sn, In, and C at a concentration of between about 0.01 and about 10 wt. %, can greatly reduce the diffusivity of Cu at Cu interfaces, surfaces and grain boundaries which result in reduced stress-induced migration, electromigration damage and corrosions.

The present invention Cu alloys prolong the lifetime of IC chips. It is noted that the Cu lines are nominally heated to between 200 and 400° C. during the VLSI processing steps. The heat treatments results in a higher concentration of solute at Cu grain boundaries and surfaces than inside the Cu grain.

Figure 11:
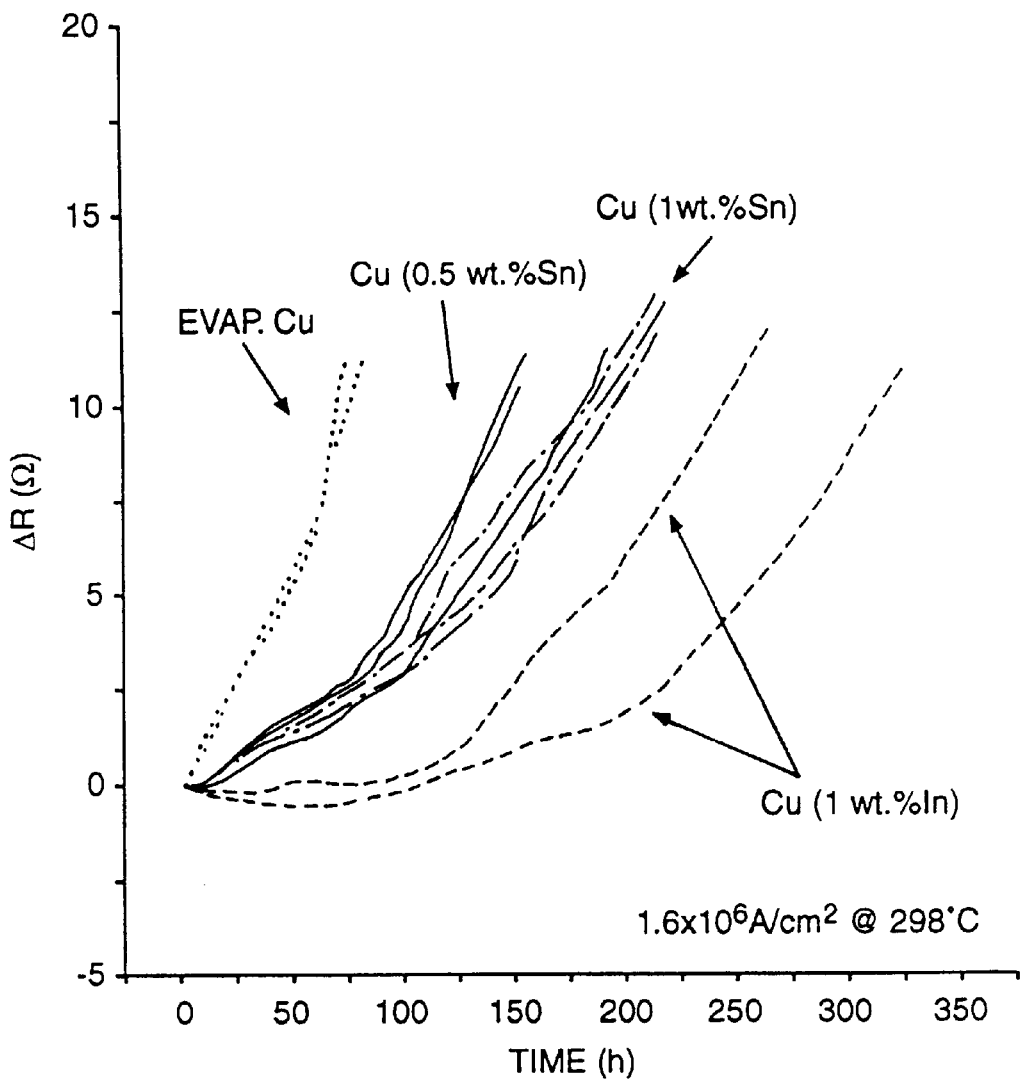
FIG. 11 is a graph showing the line resistance change as a function of electromigration stress time for different copper alloys of the present invention.

FIG. 11 shows the line resistance increase as a function of electromigration stress time for different Cu alloys. The sample tested were pure Cu, Cu(0.5wt. % Sn), Cu(1wt. % Sn) and Cu(1wt. % In). As seen in FIG. 11, the Cu alloy with 1% In has the best electromigration resistance among the samples tested. The resistivity of the samples are shown in Table 1.

TABLE 1

| Composition | $\rho(\mu\Omega\text{-cm})$ |
|---|---|
| Cu | 1.9 |
| Cu(0.5 wt. % In) | 2.6 |
| Cu(1 wt. % In) | 2.9 |
| Cu(2 wt. % In) | 3.2 |
| Cu(0.5 wt. % Sn) | 2.6 |
| Cu(1 wt. % Sn) | 3.1 |
| Cu(2 wt. % Sn) | 4.4 |
| Cu(0.2 wt. % C) | 1.9 |

It has been found that for present invention Cu alloys, a suitable range of C to be used is in between about 0.01 and about 10 weight percent, while a preferred range is between about 0.01 and 2 weight percent. A suitable range of Sn to be used is in between about 0.01 and about 10 weight percent, while a preferred range is between about 0.55 and about 10 weight percent. A suitable range of In to be used is in between about 0.01 and about 10 weight percent, while a preferred range is between about 0.01 and about 2 weight percent.

The result shows that the resistance change rate related to Cu drift velocity ($D_{eff}/kT)Z^*eE$ is drastically reduced by incorporating solutes of C, Sn and In in Cu. The result also shows that the diffusivity of Cu in the Cu alloy interconnects is greatly reduced due to Cu-solute interactions. It should be noted that even though only those alloys having low concentrations of the alloying element are shown in Table 1, other Cu alloys that contain high concentrations of alloying element have been formed and tested. Cu alloys contain up to 10 weight percent of alloying element have been tested and found having excellent electromigration resistance. However, at higher alloying element concentrations, the electromigration resistance is gained at the sacrifice of resistivity. A good compromise of all properties in the Cu alloy interconnects may be obtained at an optimum concentration level of the alloying element at less than 10 weight percent.

While the present invention has been described in an illustrative manner, it should be understood that the terminology used is intended to be in a nature of words of description rather than of limitation.

Furthermore, while the present invention has been described in terms of a preferred and several alternate embodiments thereof, it is to be appreciated that those skilled in the art will ratherly apply these teachings to other possible variations of the invention. For instance, more than one alloying element can be used in Cu alloy compositions to obtain the same desirable properties of improved electromigration resistance, low resistivity and good corrosion resistance. The present invention Cu alloys may also be formed by depositing layers of Cu and alloying element together and then annealing at a suitable temperature such that a solid solution of the Cu alloy is formed at the interface of the layers that contains up to 90 weight percent Cu.

The embodiments of the invention in which an exclusive property or privilege is claimed are defined as follows.

What is claimed is:

1. A method of forming a conductor comprising the steps of:

forming a conductor by copper and at least one alloying element selected from the group consisting of between about 0.01 and about 10 wt % carbon, between about 0.6 and about 1.8 wt % tin and between about 0.6 and about 10 wt % indium of the total weight of the conductor and is substantially uniformly distributed in the grains and within the grain boundaries of the copper alloy, and heating said conductor to a temperature and for a length of time that is sufficient to cause a thermally induced diffusion process of said at least one alloying element to move toward said grain boundaries such that there is a saturation of said at least one alloying element at or near said grain boundaries.

2. A method according to claim 1, wherein said conductor after heating is formed of a copper alloy having at its grain boundaries a concentration of said at least one alloying element that is at least 120% at areas not substantially adjacent to said grain boundaries.

3. A method according to claim 1, wherein said at least one element is carbon at a concentration of between about 0.01 and about 10 weight percent.

4. A method according to claim 1, wherein said at least one alloying element is tin at a concentration of between about 0.55 and about 1.8 weight percent.

5. A method according to claim 1, wherein said at least one alloying element is indium at a concentration of between about 0.06 and about 10 weight percent.

6. A method according to claim 1, wherein said conductor further comprises a liner of an adhesion/diffusion barrier layer made of a refractory metal or its nitride.

7. A method according to claim 1, wherein said copper alloy is formed by a process selected from the group consisting of collimated sputtering, evaporation, ion cluster beam deposition, electron cyclotron resonance deposition, ionized sputter deposition, chemical vapor deposition, electroless plating, electrolytic plating, co-evaporation, co-chemical vapor deposition and co-sputtering.

8. A method according to claim 1, wherein said conductor is built on a previously deposited layer of metal silicide.

9. A method according to claim 1, wherein said conductor is built on a semiconductor device.

10. A method of forming a conductor for providing electrical connections comprising the steps of:

forming a conductor of copper alloy containing one alloying element selected from the group consisting of between about 0.01 and about 10 wt % carbon, between about 0.6 and about 1.8 wt % tin and between about 0.6 and about 10 wt % indium of the total weight of the conductor and is substantially uniformly distributed in the grains and within the grain boundaries of said copper alloy, and heating said conductor at a temperature of no less than 150° C. to cause a diffusion process of said alloying element toward said grain boundaries such that the concentration of said alloying element at or near said grain boundaries is at least 120% at areas not substantially adjacent to said grain boundaries.

11. A method according to claim 10, wherein said one alloying element is carbon at a concentration of between about 0.01 and about 10 weight percent, and preferably at a concentration of between about 0.01 and about 2 weight percent.

12. A method according to claim 10, wherein said at least one alloying element is tin at a concentration of between about 0.55 and about 1.8 weight percent.

13. A method according to claim 10, wherein said at least one alloying element is indium at a concentration of between about 0.6 and about 10 weight percent.

14. A method according to claim 10, wherein said conductor is formed by a process selected from the group consisting of collimated sputtering, evaporation, ion cluster beam deposition, electron cyclotron resonance deposition, ionized sputter deposition, chemical vapor deposition, electroless plating, electrolytic plating, co-evaporation, co-chemical vapor deposition and co-sputtering.

15. A method for reducing electromigration in copper comprising the steps of:

depositing a first layer of copper, depositing a second layer of a material selected from the group consisting of carbon, tin and indium over at least a portion of said first layer, and annealing said layers at a temperature sufficient to form a solid solution of said two layers containing at least 90 weight percent copper.

16. A method according to claim 15, wherein said temperature for annealing is at least 150° C.

* * * * *